United States Patent [19]

Matsuda et al.

[11] Patent Number: 5,140,398
[45] Date of Patent: Aug. 18, 1992

[54] SWITCHING DEVICE

[75] Inventors: Hiroshi Matsuda, Yokohama; Haruki Kawada, Atsugi; Kunihiro Sakai, Yamato; Yuko Morikawa, Kawasaki; Ken Eguchi, Atsugi; Takashi Hamamoto, Yokohama; Masaki Kuribayashi, Inagi, all of Japan

[73] Assignee: Canon Kabushiki Kaisha, Tokyo, Japan

[21] Appl. No.: 136,345

[22] Filed: Dec. 22, 1987

[30] Foreign Application Priority Data

Dec. 24, 1986 [JP] Japan .................... 61-309432

[51] Int. Cl.⁵ .................... H01L 27/14; H01L 31/00
[52] U.S. Cl. .................... 357/30; 357/6; 357/8
[58] Field of Search ............ 357/30 D, 30 R, 8, 30 E, 357/6; 437/1, 2, 3, 4, 5

[56] References Cited

U.S. PATENT DOCUMENTS

| 3,754,986 | 8/1973 | Perez-Albuerne | 437/1 |
| 3,975,661 | 8/1976 | Kanatani et al. | 315/169 |
| 4,197,142 | 4/1980 | Bolton et al. | 136/89 |
| 4,371,883 | 2/1983 | Potember et al. | 357/1 |
| 4,639,277 | 1/1987 | Hawkins | 437/1 |
| 4,672,266 | 6/1987 | Taniguchi et al. | 313/509 |
| 4,695,717 | 9/1987 | Hirai et al. | 250/213 R |
| 4,741,976 | 5/1988 | Eguchi et al. | 428/690 |
| 4,775,820 | 10/1988 | Eguchi et al. | 313/504 |
| 4,871,236 | 10/1989 | Gemma et al. | 350/355 |
| 4,907,043 | 3/1990 | Uekita et al. | 357/14 |
| 4,939,556 | 7/1990 | Eguchi et al. | 357/4 |

FOREIGN PATENT DOCUMENTS

| 0155802 | 9/1985 | European Pat. Off. | |
| 0244835 | 11/1987 | European Pat. Off. | |
| 0268370 | 5/1988 | European Pat. Off. | 357/8 |
| 59-227171 | 12/1984 | Japan | 357/30 B |
| 61-163659 | 7/1986 | Japan | 357/8 |

OTHER PUBLICATIONS

Japanese Journal of Applied Physics, vol. 24, No. 5, part 2, (May 1985), pp. L373-L374, Tokyo, Japan, K. Yoshino et al., "Solid State Optical Switching and Memory Element with Conductive Polymer Controllable by Both Electric Field and Light Irradiation".

Applied Physics Letters, vol. 41, No. 6, (Sep. 1982), pp. 548-550, R. S. Potember et al., "Optical Switching in Semiconductor Organic Thin Films".

Thin Solid Films, vol. 149, No. 2, (May 25, 1987), pp. 163-170, Y. L. Hua et al., "Photoelectric Properties of Substituted Silicon Phthalocyanine Langmuir-Blodgett Film Schottky Barrier and Metal/Insulator/Semiconductor Devices".

G. L. Larkins, Jr. et al., "Langmuir-Blodgett Films as Barrier Layers in Josephson Tunnel Junctions", Thin Solid Films, 99, (1983), pp. 277-282.

"Ga/Phthalocyanine Langmuir-Blodgett Film Electroluminescent Diode", Electronics Letters, Sep. 27, 1984, vol. 20, No. 20, pp. 489-491.

"GaAs/LB Miss Switching Device", Electronics Letters, Sep. 27, 1984, vol. 20, No. 20, pp. 838-839.

N. J. Geddes et al., "Fabrication and Investigation of Asymmetric Current-Voltage Characteristics of Metal/Langmuir-Blodgett Monolayer/Metal Structure", Appl. Phys. Lett., 56(19), May 7, 1990, pp. 1916-1918.

Primary Examiner—Andrew J. James
Assistant Examiner—Sara W. Crane
Attorney, Agent, or Firm—Fitzpatrick, Cella, Harper & Scinto

[57] ABSTRACT

A switching device is provided which comprises a pair of electrodes, and a insulating zone and a conductive or semiconductive zone that are provided between said electrodes. Another switching device is also provided which comprises a pair of electrodes, and a laminated structural body in which an insulating thin film and a conductive or semiconductive thin film are alternately laminated between said electrodes in the direction vertical to the surfaces of said electrodes. This device may be used for a switching process in which an electric circuit is switched from the switched off state to the switched-on state by irradiation of electromagnetic radiation.

29 Claims, 4 Drawing Sheets

SWITCHING DEVICE

BACKGROUND OF THE INVENTION

1. Field of the Invention

The present invention relates to an optical switching device capable of switching an electrical circuit from the switched-off state to the switched-on state by the irradiation of electromagnetic radiations (such as visible light, ultraviolet rays, infrared rays, X-rays and gamma-rays.

2. Description of the Prior Art

Photoelectric conversion devices having been hitherto widely used, capable of switching electric circuits from a switched-off state to a switched-on state by the irradiation of light or pulses of light include a photoconductive cell comprising a photoconductive material such as CdS and ZnO provided with ohmic contact electrodes, a p-n-p-n junction optical switch diode, etc. However, the former is disadvantageous in that the switching speed is as low as about 100 msec. On the other hand, it is the p-n-p-n optical switch diode that can bring about on-off action by utilizing photoelectromotive force caused by irradiating light on p-n junctions of a semiconductor device, and this can have a switching speed of from 0.05 to 0.10 μsec.

However, once it is placed in the on state, the current continues to flow by the action of self-retension even when the irradiation of light is stopped. For returning it to the off state, it is necessary to decrease the circuit current by changing external conditions.

In addition to the above, there is recently produced on an experimental basis an optical switching device having the semiconductor hetero-structure super lattice structure provided with the long-period structure, comprising different kinds of semiconductors alternately laminated in layers (D.A.B. Millers, IEEE Journal of Quantum Electronics, 1985, Vol. QE-21, page 1462). It is impossible in such an optical switching device to switch an electric circuit in a high speed according to the irradiation/non-irradiation of light. However, the materials used for forming the above semiconductor hetero-structure supper lattice are limited to inorganic materials such a GaAs and Si, and also a complicated process is required for producing it. There has been no report on examples of optical-switching devices in which organic materials are used.

SUMMARY OF THE INVENTION

Accordingly, an object of the present invention is to provide an optical switching device formed with an organic material. Particularly, the object of the present invention is to provide an optical switching device employing an alternately laminated structural body comprising an ultra-thin film structural body made of an organic material.

More specifically, the present invention is characterized by comprising a device having alternately laminated structure formed by a pair of electrodes and an insulating zone and a conductive or semiconductive zone provided between said electrodes, particularly an organic device having a laminated structural body formed by alternately laminating an insulating thin film and a conductive or semiconductive thin film; and exhibiting non-linear current/voltage characteristics quite different from that of conventional optoelectric conversion devices (or transducers), when the irradiation/non-irradiation of light is repeated on such a device while applying an electric field thereto.

DETAILED DESCRIPTION OF THE PREFERRED EMBODIMENTS

The electrodes used in the present invention may include a great number of materials including metals such as Au, Ag, Al, Pt, Ni, Pb, Zn and Sn, alloys of these, or laminated structure of these, and also semiconductors such as Si (single crystal silicon, polysilicon or amorphous silicon), graphite or silicide (nickel silicide or palladium silicide), GaAs, GaP, ITO and NESA or laminated structures of these, as well as any other many materials. The pair of these electrodes may be either the same with or different from each other. Such electrodes can be formed according to conventionally known techniques for the formation of thin films, whereby the object of the present invention can be sufficiently achieved. Here, in instances in which the insulating zone in the present device is constructed of an organic material, the electrodes to be formed after the preparation of such an organic insulating layer may preferably be formed according to the procedures capable of forming a film under the condition of 300° C. or less, and, for example, there can be used electrodes formed in films according to vacuum vapor deposition or sputtering.

In utilizing the device of the present invention, the irradiation of electromagnetic radiations is always entailed, but the electrodes may not be necessarily be those perfectly transparent to the radiations, as for example visible light, metallic electrodes made of Au, Al, etc., can be used if the film thickness is to be controlled sufficiently small. Such film thickness may preferably be 2,000 Å or less, more preferably 1,000 Å or less.

Between the above electrodes, the alternately laminated structure is formed, comprising a conductive or semiconductive thin film and an insulating film. In respect of the formation of the insulating thin film, there can be utilized the vapor deposition or molecular-beam epitaxy, and besides, there can be also utilized oxide films of $SiO_2$, $Al_2O_3$, etc., as well as nitride films of $Si_3N_4$, etc., depending on the constitution of the device. In any cases, the film is required to be ultra-thin, more specifically, the film may preferably have a thickness of 500 Å or less, more preferably 200 Å or less, and still more preferably 100 Å or less and 5 Å or more. Attention should be also paid to the presence or absence of the homogeniety in the in-plane direction and thickness direction of such an insulating thin film, as it may greatly affect the device performances and the stability thereof.

A most desirable process for the formation of the insulating thin film in preferred examples of the present invention may include an LB (Langmuir Blodgett) process.

According to the LB process, it is possible to readily form a monomolecular film, or a built-up film thereof, comprising an organic compound having a hydrophobic part and a hydrophilic part in a molecule, on any of the electrodes or any substrate containing any of the electrodes, and also possible to stably provide an organic ultra-thin film having a film thickness of a molecular length order and being uniform and homogeneous over a large area.

The LB process is a process in which a monomolecular film or a built-up film thereof is prepared by utilizing the property that molecules may form on a water surface a monomolecular film with hydrophilic groups downward directed, when the balance of both is appropriately kept in the structure having the hydrophilic part and the hydrophobic part in a molecule (i.e., when the amphiphilic balance is kept).

The groups constituting the hydrophobic part may include all sorts of hydrophobic groups such as saturated or unsaturated hydrocarbon groups, condensed polycyclic aromatic groups and linear polycyclic phenyl groups which are widely generally known. These may constitute the hydrophobic part respectively alone or in combination of a plurality thereof. On the other hand, the groups most typical as the constituent factor of the hydrophilic part may include, for example, hydrophilic groups such as a carboxyl group, an ester group, an acid amide group, an imide group, a hydroxyl group, a sulfonyl group, a phosphoric acid group and an amino group (primary, secondary, tertiary or quaternary one).

It is possible to form the monomolecular film on the water surface so long as the molecules have the hydrophobic groups and the hydrophilic groups in well-balanced combination. In general, these molecules forms a monomolecular film having insulating properties, so that the monomolecular built-up film can also show the insulating properties. Thus, they can be said to be very suitable materials for the present invention. By way of an example, there can be included the molecules as shown below.

(1) Molecules Having The π-Electron Level

Coloring matters having a porphyrin skeleton, such as phthalocyanine, tetraphenyl porphyrin, etc., azulene type coloring matters having a squarilium group and a croconic methine group as bonding chains, and cyanine type similar coloring matters bonded with two nitrogen-containing heterocyclic rings such as quinoline, benzothiazole and benzoxazole, a squarilium group and a croconic methine group; or condensed polycyclic aromatic compounds such as cyanine dye, anthracene and pyrene, and linear compounds condensed with aromatic or heterocyclic compounds; etc.

(2) Polymeric Compounds

Polyimide derivatives, polyamic acid derivatives, polyamide derivatives, all sorts of fumaric acid copolymers, all sorts of maleic acid copolymers, polyacrylic acid derivatives, all sorts of acrylic acid copolymers, polydiacetylene derivatives, all sorts of vinyl compounds, synthetic polypeptides, biopolymers such as bacteriorhodopsin and cytochrome, etc.

(3) Fatty Acids

Carboxylic acids and carboxylates having a long-chain alkyl group, or fluorine-substituted compounds of these, esters having at least one long-chain alkyl group, sulfonic acid and salts thereof, phosphoric acid and salts thereof or fluorine-substituted compounds of these, etc.

Of these compounds, it is desirable particularly from the viewpoint of thermal resistance to utilize the high molecular compounds or to use the macrocyclic compound such as phthalocyanine. Especially, not only such thermal resistance can be made excellent but also the film thickness per one layer can be controlled to about 5 Å by using the polymeric materials such as polyimides, polyacrylic acids, all kinds of fumaric acid copolymers and all kinds of maleic acid copolymers.

Needless to say, in the present invention, the materials other than the above can be also desirable for the present invention so long as they are suited to the LB process.

The above amphiphilic molecules may form on the water surface a monomolecular film with the hydrophilic groups downward directed. Here, the monomolecular film on the water surface has a feature of a two-dimensional system, wherein the formula of ideal gas:

$$\pi A = kT$$

can be established between the area A per molecule and the surface pressure $\pi$, when the molecules are scatteredly spread out, to form a "gaseous film". Herein, k represents the Boltsmann's constant, and T represents the absolute temperature. If A is made sufficiently small, the intermolecular mutual action can be strengthened to give a "condensed film (or solid film)" of a two-dimensional solid. The condensed film can be moved layer by layer to the surface of any object such as resins or metals of various materials or shapes. The monomolecular film or built-up film thereof can be formed by use of this process, and the resulting film can be used as the insulating zone, namely, a potential barrier layer, for the optical switching device the present invention demonstrates.

Specific preparation process may include, for example, the processes described below.

Figure 4:
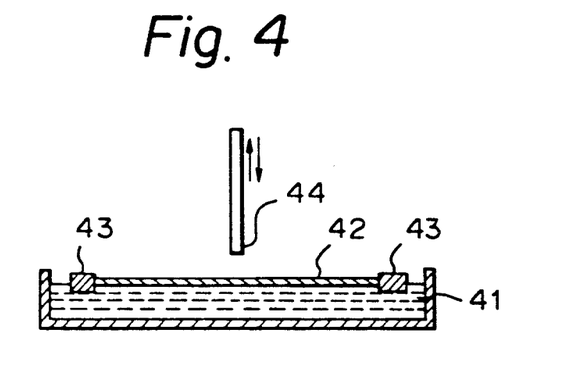
FIG. 4 is an explanatory view diagramatically showing a method of forming the insulating layer comprising an organic coloring matter, of the present invention according to an LB process.

A desired organic compound is dissolved in a solvent such as chloroform, benzene and acetonitrile. Next, using an appropriate apparatus as shown in FIG. 4 of the accompanying drawings, the resulting solution is spread over an aqueous phase 41 to form the organic compound into a film.

Figure 5A:
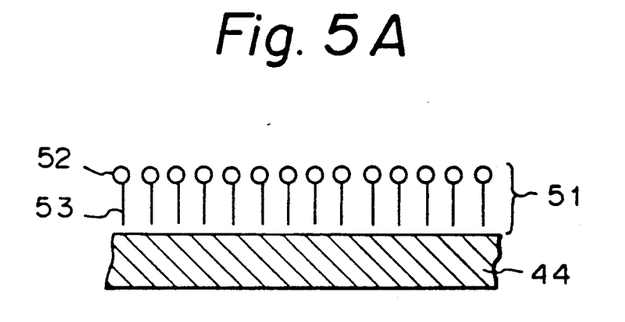
FIG. 5A and FIG. 5B are schematic views illustrating monomolecular films.

Next, a partition plate (or a float) 43 is provided so that the thus spread layer 42 may not be freely scattered to overspread, whereby the spreading area of the spread layer 42 can be limited to control the gathering of the film substance to obtain the surface pressure $\pi$ proportional to the gathering. This partition plate 43 is moved to minimize the spreading area to control the gathering of the film substance, and then the surface pressure is gradually increased, and there can be set the surface pressure $\pi$ suited for the preparation of the film. While maintaining this surface pressure, a substrate 44 is moved vertically upward or downward, so that a monomolecular film comprising the organic compound can be transferred onto the substrate 44. Such a monomolecular film 51 comprises a film in which the molecules are arranged in regular order as schematically shown in FIG. 5A or FIG. 5B.

The monomolecular film can be prepared as above, and the above operation may be repeated to form the built-up film with a desired built-up number. The monomolecular film 51 can be transferred onto the substrate 44 by not only the above-described vertical dipping process but also a horizontal lifting process and a rotating cylinder process.

The horizontal lifting process is a process in which a substrate is made in horizontal contact with the water surface to transfer the monomolecular film, and the rotating cylinder process is a process in which a cylindrical substrate is rotated on the water surface to transfer the monomolecular film 51 onto the surface of the substrate 44.

Figure 5B:
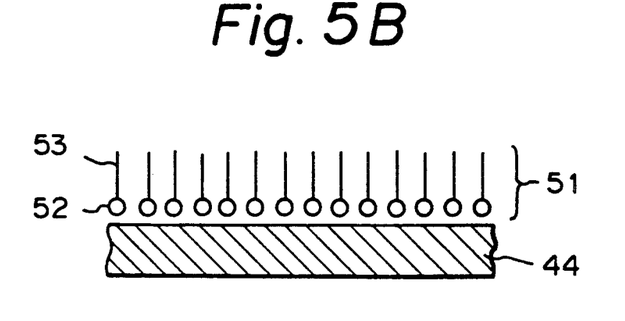
Figure 6A:
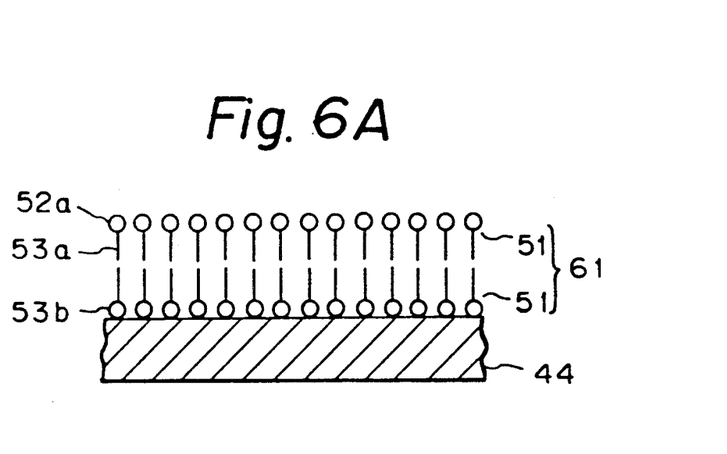
FIGS. 6A, 6B and 6C are schematic views illustrating built-up films.

According to the above vertical dipping process, the substrate 44 whose surface is hydrophilic is drawn up from the water in the direction crossing the water surface, thus forming on the substrate 44 the monomolecular film 51 comprising the organic compound, whose hydrophilic part 52 comprising the organic compound faces to the substrate 44 (FIG. 5B). If the substrate is moved upward and downward as mentioned above, the monomolecular film 51 is laminated layer by layer every step to form a built-up film 61. Since the direction of the film-forming molecules is reversed in the drawing-up step and the dipping step, this method can form a Y-type film in which the hydrophilic group parts 53a and 53b comprising the organic compound face each other between the respective layers of the monomolecular film 51 (FIG. 6A).

Figure 6B:
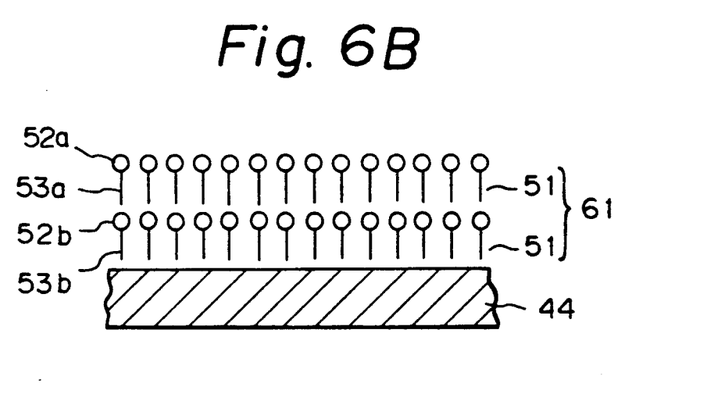
Figure 6C:
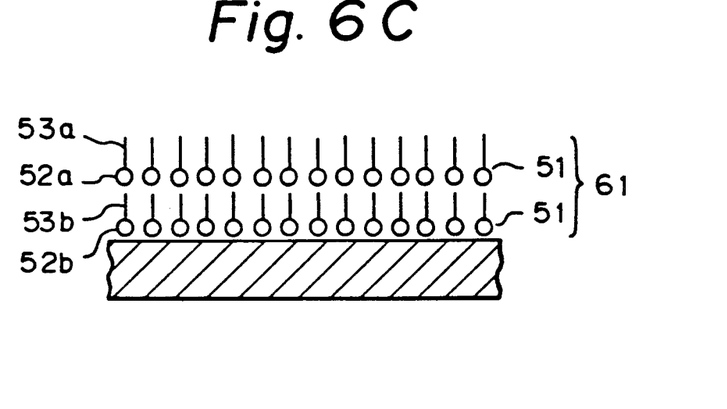

In contrast thereto, according to the horizontal lifting process, the monomolecular film 51 whose hydrophobic part 53 comprising the organic compound faces to the substrate 44 (FIG. 5A) is formed on the substrate 44. According to this method, the direction of the film-forming molecules does not alternate if the monomolecular films 51 are built-up, and there can be formed an X-type film in which the hydrophobic parts 53b face to the substrate 44 in all the layers (FIG. 6B). To the contrary, the built-up film 61 whose hydrophilic parts 52b face towards the substrated 44 in all the layers is called a Z-type film (FIG. 6C).

The methods of transfer of the monomolecular film onto the substrate are not limited to the above processes, and there can be also employed a method in which the substrate is pulled out from a roll into the aqueous phase, when a substrate with a large area is used. The direction toward the substrate, of the above-mentioned hydrophilic part and hydrophobic part is defined as a principle, and can also be changed by a surface treatment or the like of the substrate.

Figure 1:
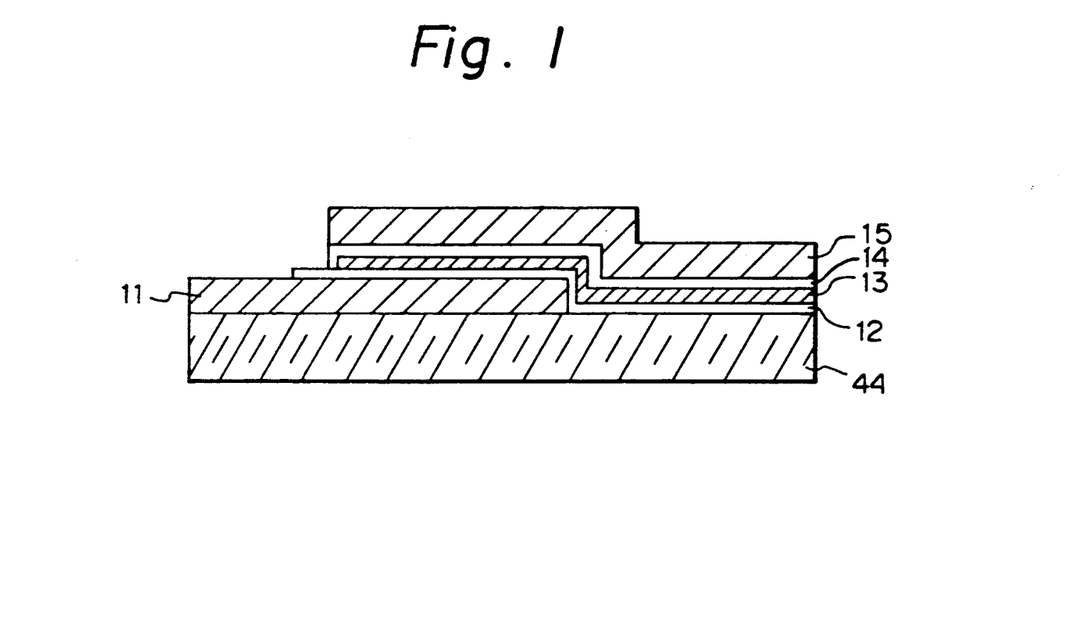
FIG. 1 is a cross-section illustrating a switching device of the present invention.

FIG. 1 is a cross-section of a switching device of the present invention. The switching device illustrated in FIG. 1 comprises a substrate 44, provided thereon with a pair of electrodes (an upper electrode 15 and a lower electrode 11) and an alternately laminated structural body comprised of an insulating thin film 12, a conductive (or semiconductive) thin film 13 and an insulating thin film 14 that are disposed between said electrodes 15 and 11.

The insulating thin films 12 and 14 may preferably be formed in films according to the LB process described above.

In the present invention, metal films made of Al, Ag, Zn, Sn, Pb, etc. or alloy films of these and semiconductive thin films made of $As_2Se_3$, CdS, ZnO, GaAs, Si (single crystal silicon, polysilicon or amorphous silicon), etc. can be used as the conductive or semiconductive thin film 13. In the present invention, such conductive or semiconductive thin film 13 is required to have a film thickness of 500 Å or less, preferably 100 Å or less, and more preferably 50 Å or less. Especially when metals or alloys thereof are used, it may preferably have a film thickness of 50 Å or less.

The conductive or semiconductive thin film 13 can be formed by using conventionally known thin-film formation techniques, but, in particular, may preferably be formed according to a vacuum vapor deposition process, a cluster ion beam process, a CVD process, a plasma polymerization process, an MBE process, or a sputtering process.

In the present invention, the insulating thin film can be formed with a porous polymer. In the present optical switching device, a conductive or semiconductive zone in the form of micro-zones may be formed in a dispersedly mixed state in the porous polymer. In the present invention, an insulating zone and conductive or semiconductive zone in the form of micro-zones may also be formed in the dispersedly mixed state by making the porosity highly dense.

In the optical switching device of the present invention, the interface at which the insulating thin film and the conductive or semiconductive thin film are joined may be in a discontinuous form.

The conductive or semiconductive zone used in the switching device of the present invention, particularly when formed at an outer most surface, may preferably be covered with an insulating zone. Such an insulating zone may be constituted of the material of the kind same with or different from the insulating material provided on another electrode (lower electrode), and is formed according to the method as already described. Then, the electrode (upper electrode) can be formed according to the method as described above.

In the present invention, the substrate 44 for supporting the thin films laminated with inorganic or organic materials as described above may be made of any materials including metals, glass, ceramics, plastics, etc., or there can be also used biomaterials having a very low thermal resistance.

The substrate 44 as described above may have any shape, but may preferably be in the shape of a flat sheet, without being limited to the flat sheet at all. This is because the above film formation processes have an advantage that whatever shape the surface of the substrate may have, the film can be formed following its shape.

The LB process is used in Examples of the present invention for the formation of the insulating thin film, but there can be used other processes without limitation to the LB process, so long as they can produce a very thin and uniform insulating thin film. Specifically, there may be included vacuum vapor deposition, electrolytic polymerization, CVD, etc., thus broadening the scope of the materials that can be used.

As having been described also with regard to the formation of the electrodes, any film formation processes may be used so long as they can produce a uniform thin film on the insulating thin film, without being limited to the vacuum vapor deposition or the sputtering.

In the present invention, there is also no limitation in the materials for the substrate or the shape thereof.

The effect of the present invention will be summarized below.

(1) It is shown that the optical switching performances showing the response that can not be seen in the conventional optoelectric conversion devices (or transducers) can be attained by alternately laminating the thin film insulating layer and the thin film conductive layer or thin layer semiconductive layer.

(2) By forming such a thin film insulating layer by an LB process, there can be formed a device that can achieve with ease the film thickness control in the molecular order, and can have a high reproducibility because of the excellent controllability, resulting in rich productivity.

Examples of the present invention will be described below.

EXAMPLE 1

Following the procedures shown below, produced was a sample having the structure comprising a lower electrode 11, an insulating thin film 12, a conductive thin film 13, an insulating thin film 14 and an upper electrode 15 (FIG. 1). On a glass substrate 44 treated for hydrophobicity by leaving it a whole day and night in saturated vapor of hexamethyl disilazane (HMDS), Cr was deposited as a subbing layer according to vacuum vapor deposition to have a thickness of 300 Å, followed by further deposition of Au according to the same method (film thickness: 600 Å) to form the lower electrode 11 in the form of a stripe of 1 mm wide. On this substrate, a 10-layer built-up film (film thickness: about 40 Å) comprising polyimide monomolecular films was formed by using an LB process, to provide the insulating thin film 12.

The process for preparing the polyimide monomolecular built-up film is described below in detail.

Polyamide acid represented by Formula (1) was dissolved in a mixed solvent of N,N-dimethylacetamide and benzene (1:1 V/V) (concentration calculated as a monomer: $1 \times 10^{-3}$M), and thereafter mixed with a separately prepared $1 \times 10^{-3}$M solution of N,N-dimethyloctadecylamine using the same solvent in the proportion of 1:2 (V/V) to prepare a solution of the polyamide acid octadecylamine salt represented by Formula (2).

The resulting solution was spread over an aqueous phase 41 (FIG. 4) comprising pure water of a water temperature of 20° C. to form a monomolecular film on the water surface. After the solvent was removed by evaporation, a float as a partition plate 43 was moved to make small the spread area to increase the surface pressure to 25 mN/m. While keeping the surface pressure constant, the substrate fitted with the above lower electrode was gently dipped at a speed of 5 mm/min in the direction crossing the water surface, and thereafter gently drawn up at a speed of 3 mm/min to form a Y-type two layer monomolecular built-up film. By repeating such operation, a 10 layer monomolecular built-up film was formed comprising the polyamide acid octadecylamine salt. Next, the resulting substrate was dipped in a mixed solvent of acetic anhydride, pyridine and benzene (1:1:3) for 12 hours to form the polyamide acid octadecylamine salt into an imide (Formula 3) as shown below, to obtain a 10 layer polyimide monomolecular built-up film.

Next, on the surface of this polyamide monomolecular built-up film, Al was deposited by vacuum deposition in the form of a stripe of 1 mm wide (film thickness: 20 Å), crossing in right angle to the lower electrode, to form the conductive thin film 13. In this step, the temperature of the substrate surface was kept to room temperature, and here the film formation rate was controlled to 3 Å/sec. Thereafter, the inside of the chamber was returned to normal pressure, and the surface of the resulting Al conductive thin film was oxidized to form the insulating thin film 14 comprising $Al_2O_3$. After this step, the inside of the chamber was again evacuated, and Al (film thickness: 300 Å) and Au (film thickness: 600 Å) were deposited in succession by vapor deposition to provide the upper electrode 15.

Figure 2:
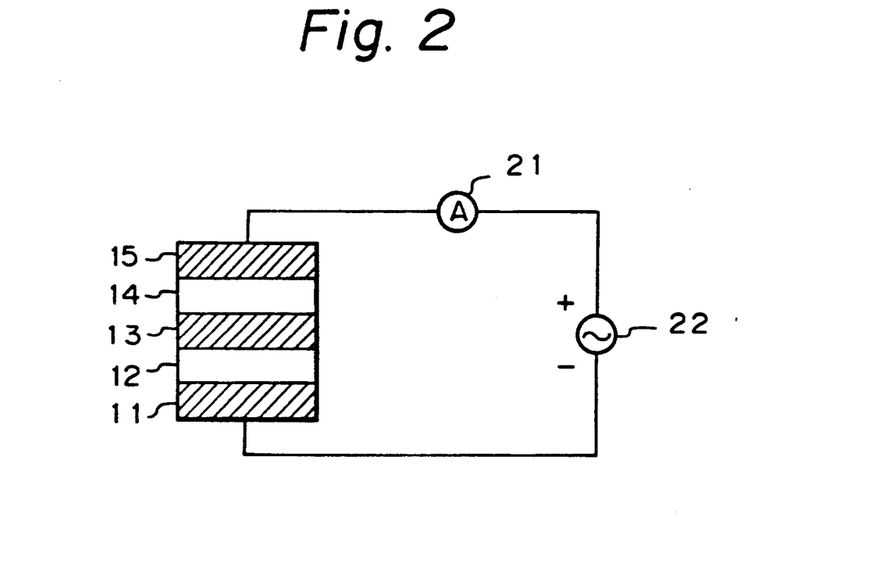
FIG. 2 is a diagram illustrating a measuring circuit used in Examples of the present invention.

The curent characteristics (V-I characteristics) obtained when a voltage was applied between the upper electrode and lower electrode of the sample prepared in the above manner were measured. An electric circuit diagram for that purpose, using an ammeter 21 and an input electric source 22, is shown in FIG. 2.

Figure 3A:
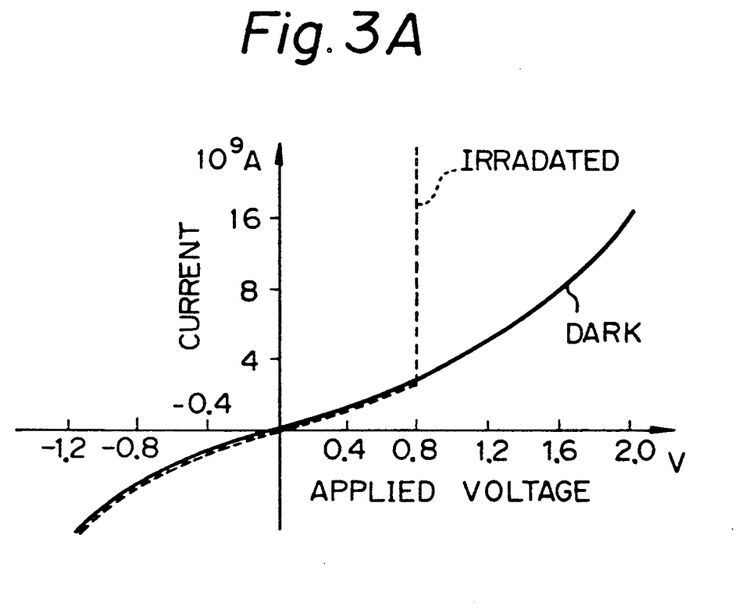
FIG. 3A and FIG. 3B are graphs showing the optoelectric characteristics of a switching device of the present invention.

As a result, the off state (resistance value: ca.$10^8$ Ω) was shown under the dark at an applied voltage of 1.2 V (FIG. 3A). On the other hand, under the irradiation of light (white light: 70 $\mu$W/0.55 $cm^2$), the off state was kept up to the threshold limit value voltage (Vth=0.8 V), but the on state (resistance value: 10 Ω) was shown at the applied voltage exceeding this threshold limit value. The switching speed to this on state was less than 1 μsec, and the interruption of the irradiaiton of light immediately resulted in the switching to the off state. The switching speed in this instance was also less than 1 μsec.

EXAMPLE 2

On the glass substrate 44, Cr was deposited as a subbing layer by vacuum vapor deposition to have a thickness of 300 Å, followed by further deposition of Au by the same method (film thickness: 600 Å) to form the lower electrode 11 in the form of a stripe of 1 mm wide. On this substrate 44, a 10 layer polyimide monomolecular built-up film was formed according to the same procedures as in Example 1, to provide the insulating thin film 12.

Next, on this polyimide monomolecular built-up film, an amorphous silicon film was formed with a film thickness of 30 Å, to provide a semiconductive thin film 13. Here, the film formation was carried out by a glow discharge process [introduced gas: $SiH_4$, $H_2$ (volume ratio 1:9); rf power: 0.01 W/$cm^2$; pressure: 0.5 torr; substrate temperature: 250° C.; deposition rate: 40 Å/min]. Subsequently, a mixed gas comprising silane ($SiH_4$) and ammonia gas was introduced, and a silicon nitride ($Si_3N_4$) film was deposited with a film thickness of 15 Å (rf power: 0.02 W/$cm^2$; pressure: 0.5 torr; substrate temperature: 250° C.; deposition rate: 50 Å/min), to form the insulating thin film 14.

Next, on the surface of this silicon nitride film Al (film thickness: 300 Å) and Au (film thickness: 600 Å) were deposited in succession by vacuum vapor deposition in the form of a stripe of 1 mm wide, crossing in right angle to the lower electrode 11, to form the upper electrode 15. On the sample thus obtained, the V-I characteristics were measured in the same manner as in Example 1. As a result, there was shown the similar switching performance.

EXAMPLES 3 to 7

Samples were prepared in entirely the same manner as in Example 1 except that the insulating materials shown in Table 1 were used to form the insulating thin film 12, and the V-I characteristics were measured. As a result, all the samples showed similar switching performance.

TABLE 1

| Example | Materials for insulating thin film 12 | Layer number | Conditions for film formation | Thickness of insulating thin film (Å) |
|---|---|---|---|---|
| 3 | t-Butyl substituted lutetium diphthalocyanine | 8 | F = 25 mN/m | 180 |
| 4 | $C_{10}H_{21}C\equiv C-C\equiv C-(CH_2)COOH$ | 8 | F = 20 mN/m; polymerized by irradiation of ultra violet light after film formation | 140 |
| 5 | SOAZ (X) | 8 | F = 20 mN/m | 120 |
| 6 | (Y) A methacrylic acid/styrene copolymer | 10 | After film formation by adding N-hexadecyldimethylamine (F = 25 mN/m), this was removed by dipping the film in a n-hexane/acetic acid (50:1%) solution | 50 |
| 7 | Bacteriorhodopsin | 8 | F = 20 mN/m | — |

EXAMPLE 8

On a glass substrate, Cr was deposited as a subbing layer according to vacuum vapor deposition to have a thickness of 300 Å, followed by further deposition of Au according to the same method (film thickness: 600 Å) to form a lower electrode in the form of a stripe of 1 mm wide. On this substrate, a silicon nitride ($Si_3N_4$) film was deposited with a film thickness of 40 Å by a glow discharge process [introduced gas: a $SiH_4/NH_3$ mixed gas ($SiH_4$: $H_2$: $NH_3 = 2:18:80$ by volume); rf power: 0.02 W/cm$^2$; pressure: 0.5 torr; substrate temperature: 300° C.; deposition rate: 60 Å/min], to form an insulating zone.

Next, on the surface of this silicon nitride film, Al was deposited by vacuum vapor deposition (film thickness: 20 Å) in the form of a stripe of 1 mm wide, crossing in right angle to the lower electrode, to form a conductive zone. Thereafter, the inside of the chamber was returned to normal pressure, and the surface of the resulting Al conductive layer was oxidized to form an insulating zone. Subsequently, the inside of the chamber was again evacuated, and Al (film thickness: 300 Å) and Au (film thickness: 600 Å) were deposited in succession by vapor deposition to provide the upper electrode.

Figure 3B:
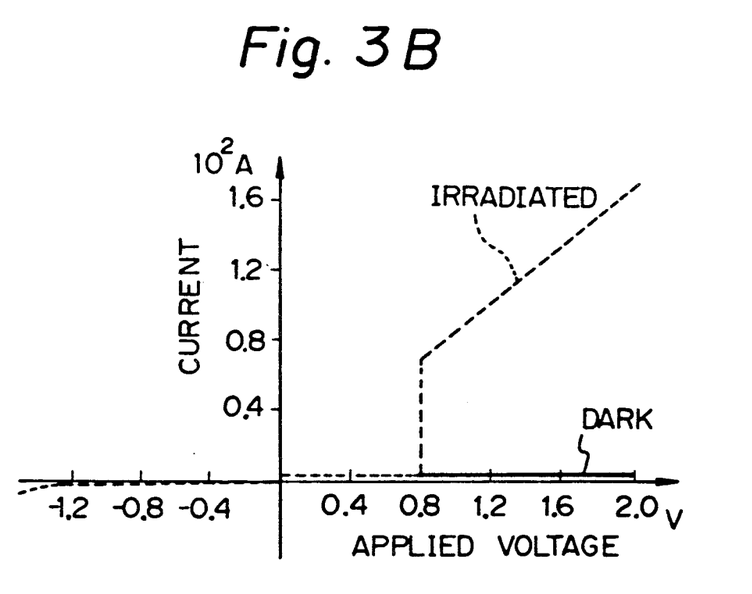

The current characteristics (V-I characteristics) obtained when a voltage was applied between the uper electrode and lower electrode of the sample prepared in the above manner were measured (The instance in which a positive charge was applied to the upper electrode was regarded as the direction of normal flow). As a result, similar to the characteristics shown in FIG. 3A, the off state (resistance value: ca. $10^8$ Ω) was shown under the dark at an applied voltage of 1.2 V. On the other hand, under the irradiation of light (white light: 70 μW/0.55 cm$^2$), the off state was kept up to the threshold limit value voltage (Vth=0.8 V), but, similar to the characteristics shown in FIG. 3B, the on state (resistance value: ca. 10 Ω) was shown at the applied voltage exceedin this threshold limit value. The switching speed to this on state was less than 1 μsec, and the interruption of the irradiation of light immediately resulted in the switching to the off state. The switching speed in this instance was also less than 1 μsec.

EXAMPLE 9

A lower electrode and an insulating zone comprising $Si_3N_4$ were formed in the same manner as in Example 8, followed by formation of an amorphous silicon film with a film thickness of 40 Å by a glow discharge process to form a semiconductive zone (introduced gas: $SiH_4$, $H_2$; rf power: 0.01 W/cm$^2$; pressure: 0.5 torr; substrate temperature: 300° C.; deposition rate: 40 Å/min). Thereafter, the surface layer part (about 10 Å) of this amorphous silicon film was formed into silicon nitride ($Si_3N_4$) according to a thermal nitriding process. Next, Al (film thickness: 300 Å) and Au (film thickness: 600 Å) were deposited in succession by vacuum vapor deposition in the form of a stripe of 1 mm wide, crossing in right angle to the lower electrode, to form an upper electrode. On the sample thus obtained, the V-I characteristics were measured in the same manner as in Example 1. As a result, there was shown the similar switching performance.

EXAMPLE 10

An Cr-Au lower electrode and a $Si_3N_4$ insulating zone were formed in the same manner as in Example 8, followed by vacuum vapor deposition of Ag (film thickness: 20 Å) to form a conductive zone. Subsequently, a silicon nitride ($Si_3N_4$) film was deposited with a film thickness of 15 Å by a glow discharge process. After this step, Al (film thickness: 300 Å) and Au (film thickness: 600 Å) were deposited in succession by vacuum vapor deposition in the form of a stripe of 1 mm wide, crossing in right angle to the lower electrode, to form an upper electrode. With the sample thus obtained, the V-I characteristics were measured in the same manner as in Example 1. As a result, there was shown similar switching performance.

EXAMPLE 11

A sample was prepared in the same manner as in Example 10 except that the conductive zone comprised of Ag was replaced by a semiconductive zone comprised of ZnS (film thickness: 40 Å) (by an ion cluster beam process; accelerated voltage: 3 kV; substrate temperature: 150° C.; deposition rate: 40 nm/min). On the sample thus obtained, the V-I characteristics were measured in the same manner as in Example 1. As a result, there was shown similar switching performance.

We claim:

1. A switching device, comprising:
 a laminated structure comprising a pair of electrodes, and at least two insulating zones and a conductive or semiconductive zone that are provided between said pair of electrodes, and
 a means for applying electromagnetic radiation to said laminated structure,
 wherein said conductive or semiconductive zone is provided between said insulating zones and has a thickness of 5 Å to 100 Å, and wherein said switching device is switched from an off-state to an on-state under application of a voltage exceeding a threshold voltage when said laminated structure is exposed to electromagnetic radiation.

2. The switching device of claim 1, wherein said conductive or semiconductive zone is disposed separate from said electrodes through the interposition of said insulating zone.

3. The switching device of claim 1, wherein said insulating zones and conductive or semiconductive zones are respectively formed by alternately laminating insulating thin films and conductive or semiconductive thin films to form a laminated structural body.

4. The switching device of claim 3, wherein said insulating thin films have a film thickness of 10 Å to 500 Å.

5. The switching device of claim 3, wherein said conductive or semiconductive thin films have a film thickness of 5 Å to 100 Å.

6. The switching device of claim 1, wherein said insulating zones comprise monomolecular films or monomolecular built-up films consisting of an organic compound.

7. The switching device of claim 6, wherein said monomolecular films or monomolecular built-up films are insulating thin Langmuir-Blodgett films.

8. The switching device of claim 7, wherein said insulating thin films comprise Langmuir-Blodgett films comprising a compound having a $\pi$ electron level, a polymeric compound or a fatty acid.

9. The switching device of claim 1, wherein said insulating thin films are oxide or nitride films.

10. The switching device of claim 1, wherein said insulating zones comprise a conductive metal-oxide film.

11. The switching device of claim 1, wherein said conductive or semiconductive zone comprises a conductive or semiconductive thin film, and wherein said conductive or semiconductive thin film comprises a film made of a metal selected from the group consisting of Al, Ag, Zn, Sn and Pb or an alloy thereof, $As_2Se_3$, CdS, ZnO, GaAs or Si including single crystal silicon, polysilicon or amorphous silicon.

12. The switching device of claim 1, wherein said conductive or semiconductive zone has a thickness of 5 Å to 50 Å.

13. The switching device of claim 3, wherein said conductive or semiconductive zone has a thickness of 5 Å to 50 Å.

14. The switching device of claim 1, wherein one electrode is light-transmissive.

15. The switching device of claim 1, wherein said electrodes have a thickness of 2000 Å or less.

16. A switching device, comprising:
a laminated structure comprising a pair of electrodes, and a first insulating zone, a second insulating zone and a conductive or semiconductive zone that are provided between said electrodes, and
a means for applying electromagnetic radiation to said laminated structure,
wherein said conductive or semiconductive zone is provided between said first insulating zone and second insulating zone and has a thickness of 5 Å to 100 Å, wherein one electrode is made of Au, and said insulating zone adjacent to said one electrode contains a monolayer or multilayer film of an organic compound, and wherein said switching device is switched from an off-state to an on-state under application of a voltage exceeding a threshold voltage when said laminated structure is exposed to electromagnetic radiation.

17. A switching device, comprising:
a laminating structure comprising a pair of electrodes, and at least two insulating zones and a conductive or semiconductive zone that are provided between said pair of electrodes, and
a means for applying electromagnetic radiation to said laminated structure,
wherein said conductive or semiconductive zone is provided between said insulating zones and has a thickness of 5 Å to 100 Å and one of said insulating zones comprises an organic material, wherein said switching device is switched from an off-state to an on-state under application of a voltage exceeding a threshold voltage when said laminated structure is exposed to electromagnetic radiation.

18. The switching device of claims 16 or 17, wherein each of said insulating thin zones are formed by insulating thin films of 10 Å to 500 Å thickness.

19. The switching device of claims 16 or 17, wherein said conductive or semiconductive zone is formed by conductive or semiconductive thin films of 5 Å to 50 Å thickness.

20. The switching device of claims 16 or 17, wherein said insulating zones comprise monomolecular films or monomolecular built-up films consisting of an organic compound.

21. The switching device of claim 20, wherein said insulating thin films are Langmuir-Blodgett films.

22. The switching device of claim 21, wherein said insulating thin films comprise Langmuir-Blodgett films comprising a compound having a $\pi$ electron level, a polymeric compound or a fatty acid.

23. The switching device of claim 18, wherein said insulating thin films comprise thin films selected from the group consisting of oxide, nitride and Langmuir-Blodgett insulating thin films and combinations thereof.

24. The switching device of claim 19, wherein said conductive or semiconductive thin films comprise a film made of a metal selected from the group consisting of Al, Ag, Zn, Sn and Pb or an alloy thereof, $As_2Se_3$, CdS, ZnO, GaAs or Si including single crystal silicon, polysilicon or amorphous silicon.

25. The switching device of dlaims 16 or 17, wherein one electrode is light-transmissive.

26. The switching device of claims 16 or 17, wherein said electrodes have a thickness of 2000 Å or less.

27. The switching device of claim 16, wherein said conductive or semiconductive zone has a thickness of 5 Å to 50 Å.

28. The switching device according to claim 16, wherein one electrode is light transmissive.

29. The switching device according to claim 16, wherein said electrodes have a thickness of 2000 Å or less.

* * * * *

UNITED STATES PATENT AND TRADEMARK OFFICE
CERTIFICATE OF CORRECTION

PATENT NO. : 5,140,398
DATED : August 18, 1992
INVENTOR(S) : HIROSHI MATSUDA, ET AL.

It is certified that error appears in the above-identified patent and that said Letters Patent is hereby corrected as shown below:

SHEET 2 OF 4

FIG. 3A, "IRRADATED" should read --IRRADIATED--.

COLUMN 1

Line 10, "rays." should read --rays).--.

COLUMN 2

Line 46, "be" (second occurrence) should be deleted.
Line 48, "ample" should read --ample,--.

COLUMN 3

Line 41, "forms" should read --form--.

COLUMN 11

Line 26, "ov" should read --ob--.
Line 40, "exceedin" should read --exceeding--.

COLUMN 12

Line 30, "electrodes," should read --electrodes;--.

COLUMN 13

Line 26, "electrodes," should read --electrodes;--.
Line 44, "electrodes," should read --electrodes;--.

UNITED STATES PATENT AND TRADEMARK OFFICE
CERTIFICATE OF CORRECTION

PATENT NO. : 5,140,398
DATED : August 18, 1992
INVENTOR(S) : HIROSHI MATSUDA, ET AL.

Page 2 of 2

It is certified that error appears in the above-identified patent and that said Letters Patent is hereby corrected as shown below:

COLUMN 14

Line 36, "dlaims 16" should read --claims 16--.

Signed and Sealed this

Twenty-third Day of November, 1993

Attest:

BRUCE LEHMAN

Attesting Officer     Commissioner of Patents and Trademarks